US007285797B2

(12) United States Patent
Tobita

(10) Patent No.: US 7,285,797 B2
(45) Date of Patent: Oct. 23, 2007

(54) IMAGE DISPLAY APPARATUS WITHOUT OCCURENCE OF NONUNIFORM DISPLAY

(75) Inventor: Youichi Tobita, Hyogo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 210 days.

(21) Appl. No.: 11/128,308

(22) Filed: May 13, 2005

(65) Prior Publication Data

US 2005/0275607 A1 Dec. 15, 2005

(30) Foreign Application Priority Data

Jun. 9, 2004 (JP) ............................ 2004-171428

(51) Int. Cl.
*H01L 29/04* (2006.01)

(52) U.S. Cl. .......................... 257/59; 257/291; 345/82

(58) Field of Classification Search .................. 257/59, 257/291; 345/82

See application file for complete search history.

(56) References Cited

U.S. PATENT DOCUMENTS 6,859,193 B1 2/2005 Yumoto

FOREIGN PATENT DOCUMENTS

| | | |
|---|---|---|
| JP | 2003-517806 | 6/2002 |
| JP | 2003-186440 | 7/2003 |
| WO | 99/65011 | 12/1999 |

*Primary Examiner*—Long Pham
(74) *Attorney, Agent, or Firm*—Buchanan Ingersoll & Rooney PC

(57) ABSTRACT

A pixel drive circuit includes a drain voltage increase limiter circuit composed of a TFT device provided between a node and the drain of a TFT device serving as a current source, a capacitor and a switch. In a data write mode, switches are turned on to allow drive current to flow from a data line to the TFT devices. Then, respective gate voltages of the TFT devices are held in respective capacitors. In a display mode, only a switch is turned on to form a current path from a supply voltage to the TFT devices through a light-emitting diode. The voltage on a node is held constant regardless of channel modulation. Accordingly, desired electric current flows through the light-emitting diode.

8 Claims, 7 Drawing Sheets

IMAGE DISPLAY APPARATUS WITHOUT OCCURENCE OF NONUNIFORM DISPLAY

BACKGROUND OF THE INVENTION

1. Field of the Invention

The present invention relates to an image display apparatus, and more particularly to an image display apparatus having such current-driven light-emitting devices as organic electroluminescence (EL) devices for respective pixels.

2. Description of the Background Art

In these years, in the field of flat panel displays, attention has been being given to organic EL displays in addition to liquid crystal displays. As compared with the liquid crystal display, the organic EL display has a higher contrast ratio, a faster response characteristic and a wider viewing angle. The organic EL display has organic EL devices, which are current-driven light-emitting devices, arranged for respective pixels. As a representative example of the organic EL device, organic light-emitting diode is known.

In particular, in recent years, attention has been being given to low-temperature polysilicon thin film transistor (TFT) displays among those organic EL displays. In consideration of higher image definition and lower power consumption, the low-temperature polysilicon TFT display has thin film transistors using low-temperature polysilicon as drive devices of organic light-emitting diodes. The low-temperature polysilicon TFT display, however, tends to have such transistor characteristics as mobility and threshold voltage that vary to a relatively greater degree depending on manufacture, as compared with conventional TFTs.

With the above-described situations as a background, it has been pointed out that one problem of the organic EL display is nonuniformity in display brightness characteristic between pixels, namely "nonuniform display". Japanese National Patent Publication No. 2002-517806 for example discloses a configuration of a pixel circuit as a configuration for indicating this problem.

FIG. 7 is a circuit diagram illustrating the conventional pixel circuit disclosed in Japanese National Patent Publication No. 2002-517806.

Referring to FIG. 7, conventional pixel circuit 100 includes, for an organic light-emitting diode OLED provided as a light-emitting device, a pixel drive circuit 110 for supplying electric current according to a specified display brightness.

Pixel drive circuit 110 includes an n-type TFT device Q1 used as a current drive device, a voltage holding capacitor CH and switches S11 to S13. Here, the TFT is described hereinafter as a representative example of field effect transistors.

Organic light-emitting diode OLED is a current-driven light-emitting device and changes in display brightness according to supplied electric current. The anode of organic light-emitting diode OLED is connected to a supply voltage VH.

N-type TFT device Q1 is connected between the cathode of organic light-emitting diode OLED and a supply voltage VL. To supply voltage VL, a ground voltage or a predetermined negative voltage is applied. The gate of n-type TFT device Q1 is connected through voltage holding capacitor CH to supply voltage VL and connected through switch S12 to the drain of n-type TFT device Q1.

Switch S11 is connected between a data line DL and a node N1 at a voltage equal to that of the drain of n-type TFT device Q1.

Switch S13 is connected between the drain of n-type TFT device Q1 and the anode of organic light-emitting diode OLED.

Pixel circuit 100 having the above-described configuration performs its display operation in two modes. In a data write mode corresponding to an addressing cycle, drive current $I_{EL}$ that determines a necessary output from organic light-emitting diode OLED is driven from a constant current source 60 to data line DL.

In pixel circuit 100, switch S11 is turned on to electrically couple data line DL to node N1. Further, switch S12 is turned on to diode-connect n-type TFT device Q1 while switch S13 is turned off to electrically insulate organic light-emitting diode OLED. Accordingly, a current path from constant current source 60 through data line DL and n-type TFT device Q1 to supply voltage VL is formed and drive current $I_{EL}$ is flown through the current path.

FIG. 8 is an equivalent circuit diagram of n-type TFT device Q1 in the data write mode.

Referring to FIG. 8, since n-type TFT device Q1 is in the diode-connected state, n-type TFT device Q1 operates in a saturation region. Further, a gate to source voltage VGS is set to a voltage level necessary for allowing drive current $I_{EL}$ to flow, and held in voltage holding capacitor CH.

Here, drain current (corresponding to $I_{EL}$) in a saturation region of a field effect transistor like the TFT device is generally represented by expression (1):

$$I_{EL}=(\beta/2)\cdot(VGS-VTN)^2 \quad (1)$$

where $\beta=\mu\cdot(W/L)\cdot Cox$, and β represents current amplification factor, μ represents mobility, L represents gate channel length, W represents gate channel width, Cox represents gate capacity, and VTN represents threshold voltage.

From expression (1), gate to source voltage VGS is represented by expression (2) as indicated below, with threshold voltage VTN of the transistor to which added an amount of increase in voltage caused by drive current $I_{EL}$:

$$VGS=VDS=VTN+(2I_{EL}/\beta)^{1/2} \quad (2).$$

Furthermore, switches S11 and S12 are turned off to electrically insulate pixel circuit 100 from data line DL and electrically insulate voltage holding capacitor CH. Accordingly, as a terminal to terminal voltage of voltage holding capacitor CH, gate to source voltage VGS necessary for allowing drive current $I_{EL}$ to flow through n-type TFT device Q1 is stored.

When gate to source voltage VGS is stored in voltage holding capacitor CH and the data write mode is ended, switch S13 is turned on to connect the cathode of organic light-emitting diode OLED to the drain of n-type TFT device Q1 and thereby start a display mode.

In the display mode, in order to generate the output determined by drive current $I_{EL}$ as described above from organic light-emitting diode OLED, n-type TFT device Q1 drives the electric current according to voltage VGS stored in voltage holding capacitor CH to organic light-emitting diode OLED. In other words, n-type TFT device Q1 operates as an electric current source to allow electric current equal to drive current $I_{EL}$ to flow through organic light-emitting diode OLED.

As discussed above, in the data write mode and the display mode, the same n-type TFT device Q1 is used for supplying current and for generating current. Therefore, drive current $I_{EL}$ is kept at a constant level without being influenced by threshold voltage VTN and mobility μ of n-type TFT device Q1.

Generally, a field effect transistor including the TFT device that is used as the current drive device in pixel circuit 100 in FIG. 7 (depending on the case, the field effect transistor is hereinafter referred to as current source transistor) has the relation as shown in FIG. 9 between drain to source current IDS and drain to source voltage VDS.

Referring to FIG. 9, an operation region of the current source transistor is roughly divided into a non-saturation region and a saturation region. In the non-saturation region, drain to source current IDS increases together with drain to source voltage VDS. In the saturation region, a constant current characteristic is exhibited that is determined by only the gate to source voltage VGS regardless of drain to source voltage VDS.

The direct current characteristic represented by the dotted line in FIG. 9 is a characteristic of an ideal transistor having sufficiently large dimensions. In contrast, it is known that an actual fine transistor exhibits a more complicated characteristic, as shown by the solid line, because of the channel length and channel width resultant from the form effect and because of supply voltage.

Regarding the ideal transistor, as shown by the dotted line, once drain to source current IDS saturates, drain to source current IDS remains the same even when drain to source voltage VDS is increased. In contrast, regarding the actual transistor, even in the saturation region, drain to source current IDS slightly increases together with drain to source voltage VDS. Namely, so-called channel modulation occurs, since the effective channel length shortens when an end of a depletion layer of the drain shifts toward the source. In the saturation region, this channel modulation causes a resistance component r between the drain and the source to appear. This resistance component r corresponds to the reciprocal of the channel conductance between the drain and the source.

In pixel circuit 100 in FIG. 7, when switches S11 and S12 are turned on in the data write mode, drain to source voltage VDS according to drive current $I_{EL}$ is set as represented by expression (2). Then, switches S11 and S12 are turned off so that this voltage is held as gate to source voltage VGS in voltage holding capacitor CH.

In the display mode, when switch S13 is turned on, a voltage is supplied through organic light-emitting diode OLED from supply voltage VH to allow current to flow through n-type TFT device Q1. At this time, because of an amount of decrease in forward voltage of organic light-emitting diode OLED (depending on the case, the amount of decrease is hereinafter referred to as VF), a voltage smaller than supply voltage VH substantially by VF, i.e. (VH−VF) is applied to node N1. Accordingly, the voltage on node N1 increases from drain to source voltage VDS of n-type TFT device Q1 to (VH−VF).

Here, as shown in FIG. 9, in the saturation region, actually the channel modulation of n-type TFT device Q1 occurs due to resistance component r, and drain to source current IDS increases as drain to source voltage VDS increases.

If respective n-type TFT devices Q1 of all pixel circuits 100 arranged in rows and columns in a matrix form in a display unit have the same resistance components r, namely channel conductance, an amount of increase in current IDS would be equal between the current source transistors and accordingly these pixel circuits 100 can have uniform electric current driven to respective organic light-emitting diodes OLEDs.

Actually, however, n-type TFT devices Q1 have respective resistance components r different in magnitude from each other due to for example variations depending on manufacture, pixel circuits 100 differ from each other in electric current driven to respective organic light-emitting diodes OLEDs, causing the nonuniform display.

SUMMARY OF THE INVENTION

An object of the present invention is to provide an image display apparatus excluding influences of device characteristics of current source transistors included in pixel circuits and thereby eliminating nonuniformity of display.

According to the present invention, an image display apparatus includes: a plurality of pixel circuits arranged in rows and columns and each having a current-driven light-emitting device; a plurality of scan lines arranged correspondingly to respective rows of the plurality of pixel circuits and successively selected in constant cycles; a plurality of data lines arranged correspondingly to respective columns of the plurality of pixel circuits; and a constant current circuit provided correspondingly to the plurality of data lines and supplying, to the plurality of data lines each, drive current that is set according to a display brightness of a pixel circuit to be scanned among the plurality of pixel circuits. The plurality of pixel circuits each include: a node electrically coupled to a corresponding data line in a first mode to allow the drive current to flow into/out of the node and electrically separated from the corresponding data line in a second mode performed subsequently to the first mode; a pixel drive circuit connected between the node and a first voltage supply, writing the drive current flowing into/out of the node in the first mode and supplying, to the current-driven light-emitting device, current according to the written drive current in the second mode; and the current-driven light-emitting device provided between the node and a second voltage supply and rendered conductive in the second mode to be supplied with the current according to the drive current. The pixel drive circuit includes: first and second transistors connected in series between the node and the first voltage supply and, in the first mode, the drive current passes through the first and second transistors; and first and second capacitor elements connected to respectively hold, on respective gate electrodes of the first and second transistors, voltages determined by the drive current in the first mode.

In accordance with the present invention, influences of current source transistors in a plurality of pixel circuits arranged in a display unit are eliminated. Thus, electric current that is set according to a display brightness is driven with high precision to a light-emitting device, so that occurrence of nonuniform display can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
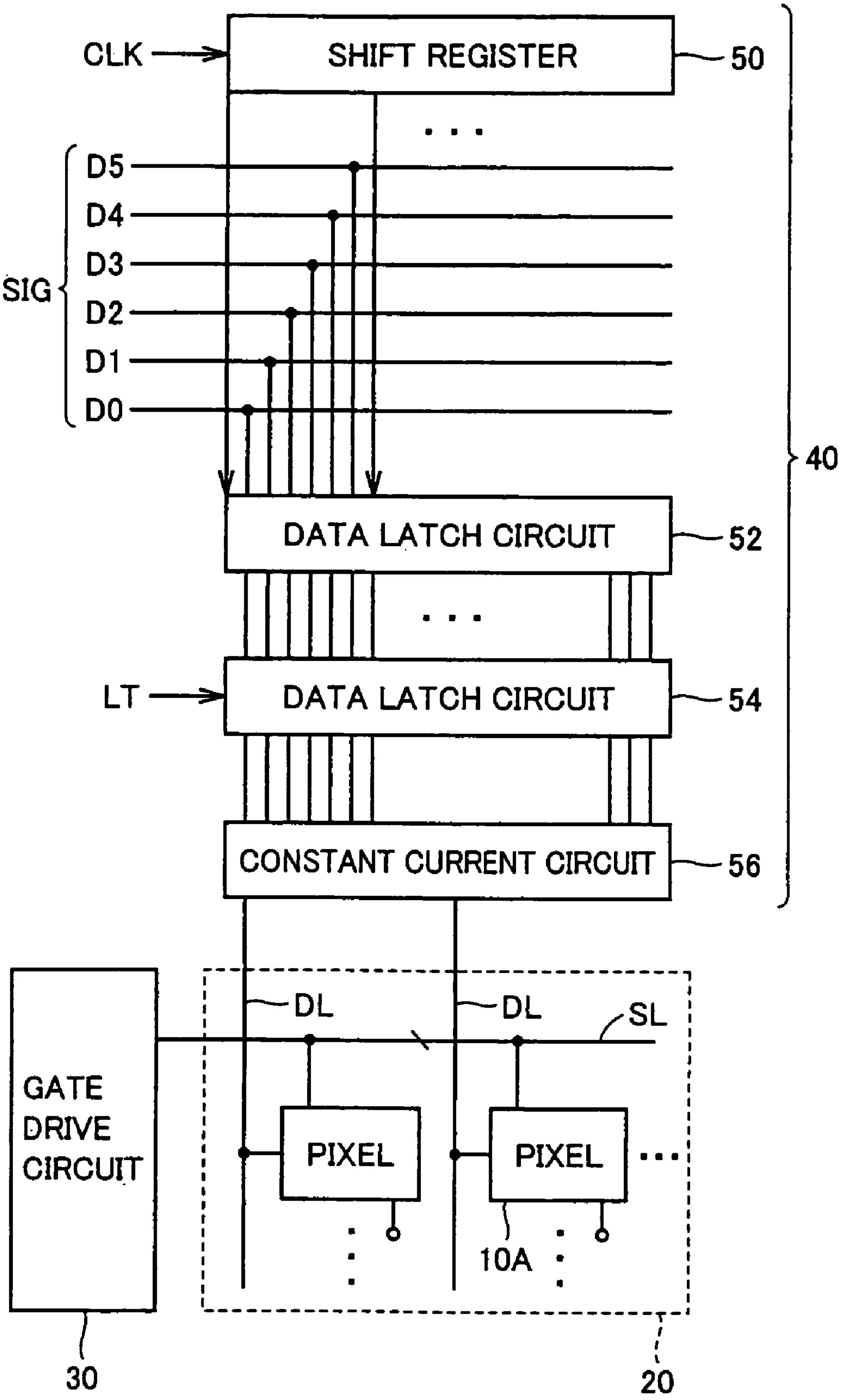
FIG. 1 is a circuit diagram showing a configuration of an image display apparatus according to a first embodiment of the present invention.

Embodiments of the present invention are hereinafter described in detail with reference to the drawings. Here, like components in the drawings are denoted by like reference characters.

FIRST EMBODIMENT

FIG. 1 is a circuit diagram showing a configuration of an image display apparatus according to a first embodiment of the present invention.

Referring to FIG. 1, the image display apparatus includes a display unit 20, a gate drive circuit 30 and a source drive circuit 40.

Display unit 20 includes a plurality of pixel circuits 10A arranged in rows and columns in a matrix form. Scan lines SL are arranged correspondingly to respective rows of pixel circuits 10A (depending on the case, hereinafter referred to as pixel rows). Further, data lines DL are provided correspondingly to respective columns of the pixel circuits (depending on the case, hereinlater referred to as pixel columns). In FIG. 1, pixel circuits of a first row, first and second columns, corresponding scan line SL1 and data lines DL1 and DL2 are representatively shown.

Based on predetermined scan cycles, gate drive circuit 30 controls the voltage on scan line SL by setting scan line SL to a select state (corresponding to a high-level potential) in a scan period and setting scan line SL to a non-select state (corresponding to a low-level potential) in a remaining, non-scan period.

Source drive circuit 40 outputs, to data line DL, display current that is set in a stepwise manner by a display signal SIG that is a digital signal of N bits (N is a natural number). FIG. 1 representatively shows the configuration implemented in a case where N is equal to six (N=6), namely where display signal SIG is comprised of display signal bits D0 to D5.

Based on the 6-bit display signal, brightness display with $2^6$=64-level gradation can be implemented at each pixel. Moreover, from respective pixels of R (Red), G (Green) and B (Blue), one color display unit may be formed to provide color display of approximately 260000 colors.

Source drive circuit 40 includes a shift register 50, first and second data latch circuits 52 and 54 and a constant current circuit 56.

For each pixel circuit 10A, display signal SIG is generated in a serial manner according to a display brightness. Namely, display signal bits D0 to D5 at each timing represent a display brightness of one pixel circuit 10A in display unit 20.

At a timing in synchronization with predetermined cycles in which setting of display signal SIG is changed, shift register 50 instructs first data latch circuit 52 to take in display signal bits D0 to D5. First data latch circuit 52 thus successively takes in and holds serially generated display signal SIG for one pixel row.

At a timing at which display signal SIG for one pixel row is taken in by first data latch circuit 52, a set of display signals latched by first data latch circuit 52 is transmitted to second data latch circuit 54 in response to activation of a latch signal LT.

Receiving pixel data for one pixel row from second latch circuit 54, constant current circuit 56 selects, for each pixel, drive current $I_{EL}$ according to the pixel data and outputs the selected current simultaneously to data lines DL arranged in the column direction.

When gate drive circuit 30 activates scan line SL corresponding to a row to be scanned, pixel circuits 10A connected to this scan line SL are activated simultaneously. Then, each pixel circuit 10A provides display of a brightness according to drive current $I_{EL}$ applied to its corresponding data line DL. Thus, pixel data for one pixel row is displayed.

The above-described operation is successively performed for each of the scan lines arranged in the row direction to display an image on display unit 20.

Figure 2:
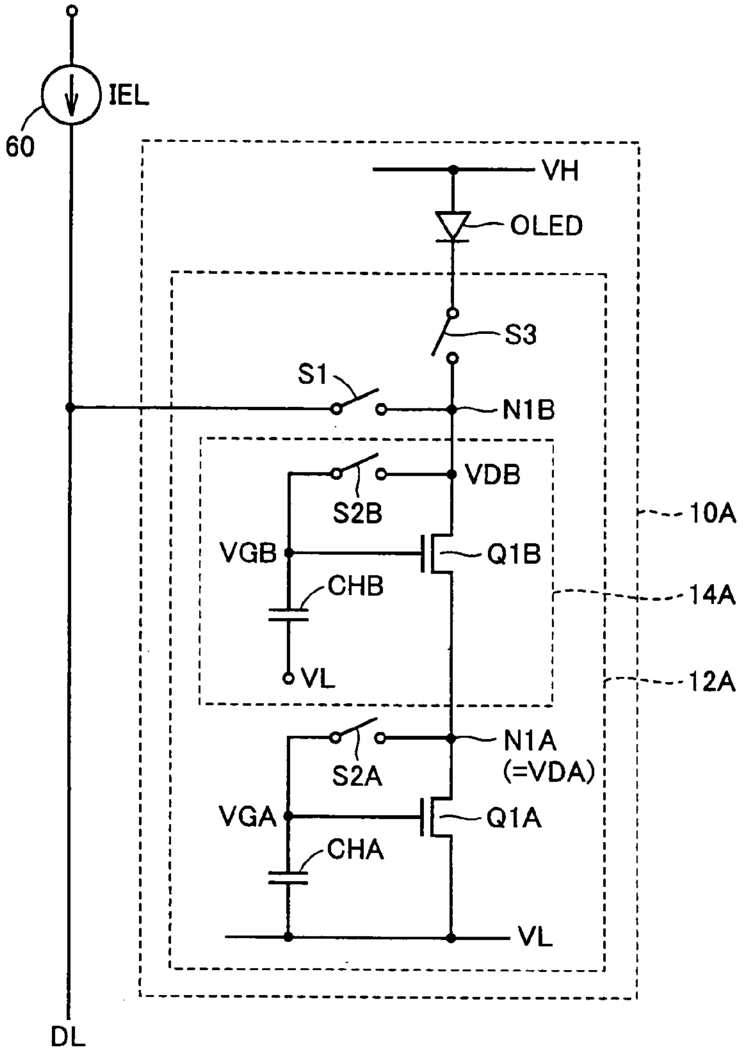
FIG. 2 is a circuit diagram showing a configuration of a pixel circuit 10A in FIG. 1.

FIG. 2 is a circuit diagram showing a configuration of pixel circuit 10A in FIG. 1.

Referring to FIG. 2, pixel circuit 10A includes an organic light-emitting diode OLED provided as a light-emitting device as well as a pixel drive circuit 12A for supplying current $I_{EL}$ according to a specified display brightness.

Pixel drive circuit 12A includes an n-type TFT device Q1A, a voltage holding capacitor CHA and switches S1, S2A, S3.

N-type TFT device Q1A is a current source transistor connected between the cathode of organic light-emitting diode OLED and a supply voltage VL.

Voltage holding capacitor CHA is connected between the gate of n-type TFT device Q1A and supply voltage VL.

Switch S1 is provided between data line DL and a node N1B and turned on in response to a control signal designating a mode of the display apparatus to electrically couple data line DL to pixel circuit 10A. Switch S3 is provided between the cathode of organic light-emitting diode OLED and node N1B and turned on in response to a control signal designating a mode of the display apparatus to electrically couple organic light-emitting diode OLED to node N1B. Switch S2A is provided between the gate and drain of n-type TFT device Q1A and turned on in response to a control signal designating a mode of the display apparatus to diode-connect n-type TFT device Q1A.

Pixel drive circuit 12A further includes an n-type TFT device Q1B connected between organic light-emitting diode OLED and n-type TFT device Q1A that is a current source transistor, as well as a capacitor CHB and a switch S2B.

Figure 7:
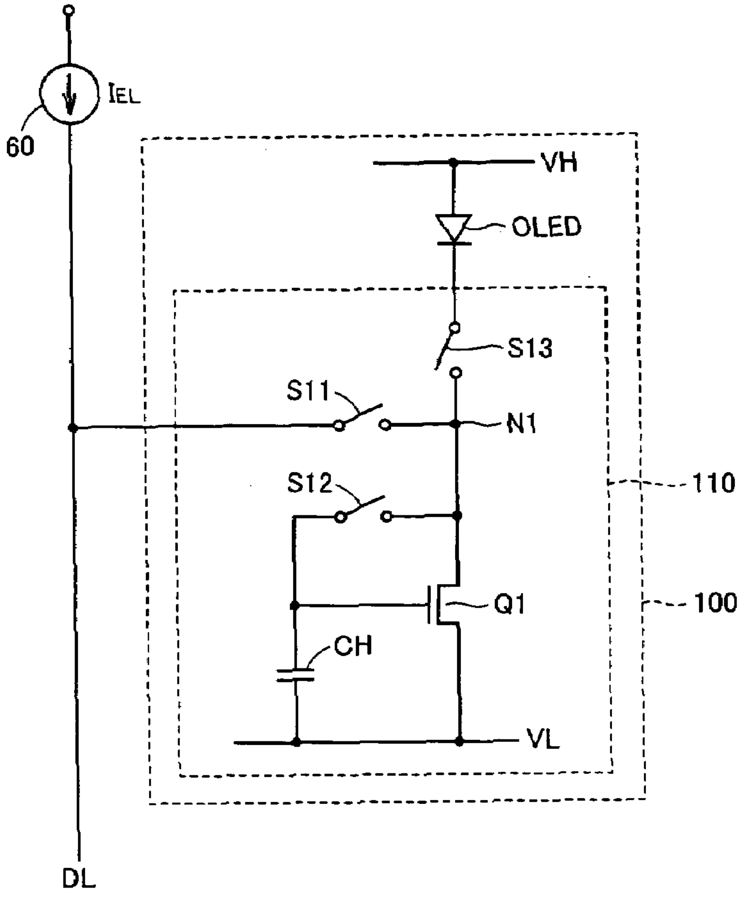
FIG.7 PRIOR ART
FIG. 7 is a circuit diagram illustrating a conventional pixel circuit disclosed in Japanese National Patent Publication No. 2002-517806.
Figure 8:
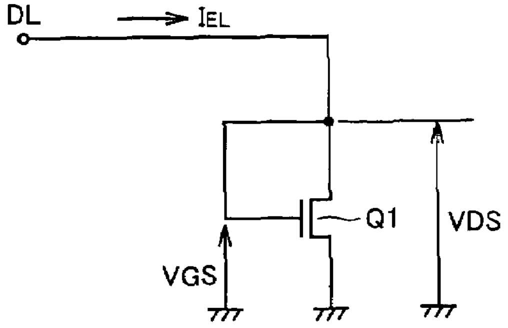
FIG.8 PRIOR ART
FIG. 8 is an equivalent circuit diagram of an n-type TFT device Q1 in a data write mode.

As discussed below, n-type TFT device Q1B, capacitor CHB and switch S2B constitute a drain voltage increase limiter circuit 14A that limits an increase of the drain voltage (corresponding to a node N1A) of n-type TFT device Q1A that is a current source transistor. Pixel circuit 10A of the present embodiment thus differs from conventional pixel circuit 100 shown in FIG. 7 in that the former includes, in current drive circuit 12A, drain voltage increase limiter circuit 14A.

Specifically, n-type TFT device Q1B has its drain connected to node N1B and its source connected to the drain (node N1A) of n-type TFT device Q1A. Between the gate of n-type TFT device Q1B and supply voltage VL, capacitor CHB is connected. Further, the gate and drain of n-type TFT device Q1B are diode-connected via switch S2B.

In the configuration described above, on/off operation of a plurality of switches S1, S2A, S2B, S3 included in pixel circuit 10A is caused by scan line SL for example, as a control signal for designating a mode of the display apparatus, that is activated to a select state or inactivated to a non-select state when the mode is switched.

Specifically, switches S1, S2A, S2B, S3 each include an n-type TFT device (not shown) and the gate of the n-type TFT device is connected to a scan line (not shown) activated by a select signal (not shown) for selecting scan line SL.

In this case, switch S1 is turned on in response to the signal of the scan line to electrically connect data line DL to node N1B. Switches S2A and S2B are turned on in response to the signal of the scan line to diode-connect respective n-type TFT devices Q1A and Q1B.

Switch S3 is turned on in response to the signal of the scan line to electrically couple the cathode of organic light-emitting diode OLED to node N1B.

Figure 3:
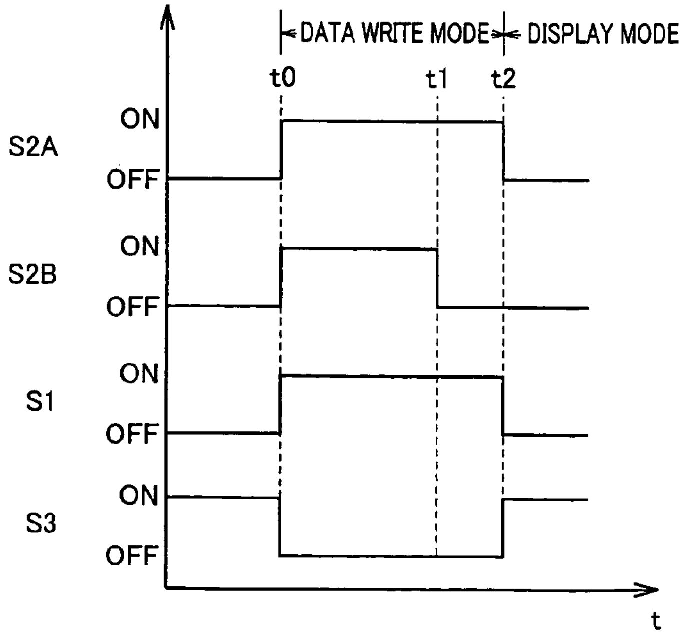
FIG. 3 is a timing chart illustrating operation of switches S1, S2A, S2B, S3.

FIG. 3 is a timing chart illustrating the operation of switches S1, S2A, S2B, S3.

Referring to FIG. 3, at time t0 in a data write mode, switches S2A, S2B, S1 are turned on simultaneously. As switches S2A and S2B are turned on, respective n-type TFT devices Q1A and Q1B are diode-connected. Further, as switch S1 is turned on, drive current $I_{EL}$ corresponding to a display brightness is supplied from data line DL to node N1B. Here, although FIG. 3 shows that switches S1, S2A, S2B are turned on at the same timing, they may be turned on at respective timings different from each other and the order in which they are turned on is not limited to a specific one.

Figure 4:
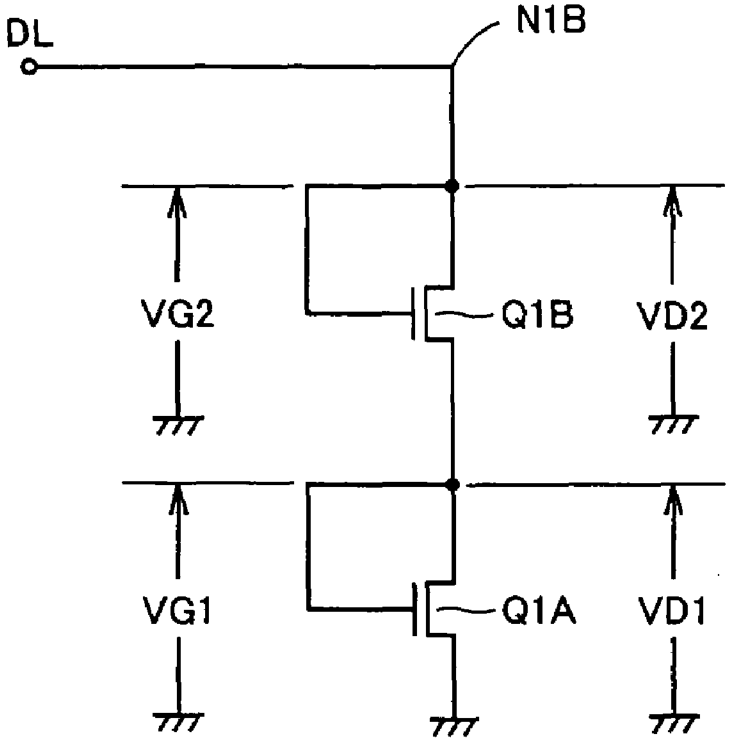
FIG. 4 is an equivalent circuit diagram of pixel circuit 10A at time t0.

FIG. 4 is an equivalent circuit diagram of pixel circuit 10A at time t0. In FIG. 4, supply voltage VL is a ground voltage.

Referring to FIG. 4, when drive current $I_{EL}$ is supplied to flow from data line DL through node N1B to series-connected n-type TFT devices Q1A and Q1B, respective drain voltages of the TFT devices are VD1 and VD2. Further, because of the diode connection, respective gate voltages VG1 and VG2 of the TFT devices are equivalent to drain voltages VD1 and VD2 respectively.

Here, for simplifying the description, it is supposed that n-type TFT devices Q1A and Q1B are identical to each other in transistor dimensions (gate channel length: L, gate channel width: W), threshold voltage VTN and current amplification factor β.

Regarding n-type TFT device Q1A, drain to source voltage VDS1 and gate to source voltage VGS1 are identically represented by the following expression:

$$VDS1 = VGS1 = VTN + (2I_{EL}/\beta)^{1/2} \quad (3).$$

Regarding n-type TFT device Q1B as well, drain to source voltage VDS2 and gate to source voltage VGS2 are identically represented by the following expression:

$$VDS2 = VGS2 = VTN + (2I_{EL}/\beta)^{1/2} \quad (4).$$

Since these devices have the same size, the same voltage (corresponding to VDS1=VDS2) is applied as the drain to source voltage.

Between gate voltage VG2 of n-type TFT device Q1B and gate voltage VG1 of n-type TFT device Q1A, there is a relation of VG2=2VG1. These voltages VG1 and VG2 are respectively held in capacitors CHA and CHB in FIG. 2.

Referring again to FIG. 3, when the mode changes from the data write mode to the display mode, switches S1, S2A, S2B make a transition to an off state. These switches may be turned off simultaneously. However, as shown in FIG. 3, it is desirable to set the turn-off timing in such a manner that allows switch S2B to be turned off first at time t1 and allows switches S2A and S1 to subsequently be turned off at time t2 (>t1). This is for avoiding the situation in which switch S2A is turned off first to cause the potential level of node N1A to decrease and this level is held as the gate voltage of the n-type TFT device Q1A.

At time t2 at which all of switches S1, S2A, S2B have been turned off, switch S3 is turned on to start the display mode. In response to the turn-on of switch S3, current $I_{EL}$ is driven through organic light-emitting diode OLED from supply voltage VH to n-type TFT devices Q1B and Q1A.

At this time, the voltage level of node N1B increases from VG2 (=VD2) in the data write mode to voltage (VH−VF), which is determined by subtracting forward voltage VF of the diode from supply voltage VH.

Figure 9:
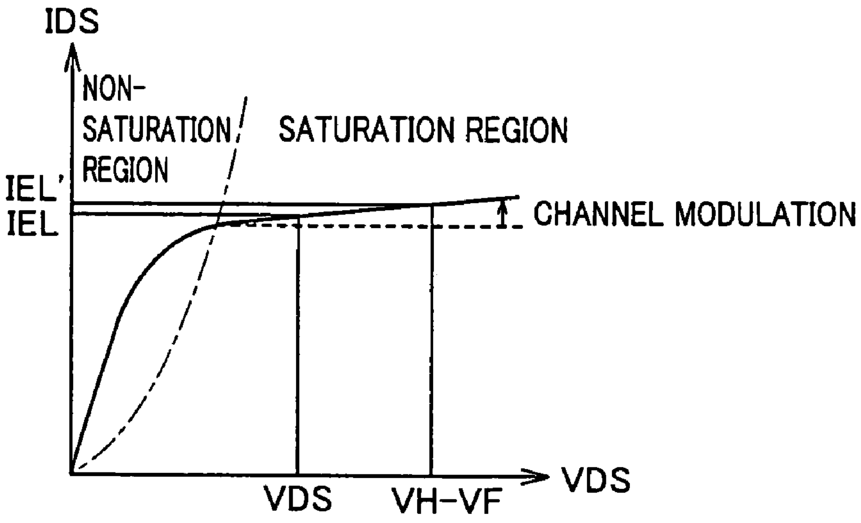
FIG.9 PRIOR ART
FIG. 9 shows a general relation between drain to source current IDS and drain to source voltage VDS of a field effect transistor.

Regarding n-type TFT device Q1B, as drain to source voltage VDS increases, drain to source current IDS increases because of the channel modulation shown in FIG. 9. In other words, current $I_{EL}'$ larger than desired current $I_{EL}$ is driven.

Here, if the drain to source current increases to $I_{EL}'$, the same current $I_{EL}'$ would also flow between the drain and the source of series-connected n-type TFT device Q1A. Thus, since the current of n-type TFT device Q1A increases, the voltage level of node N1A increases.

However, if the voltage level of node N1A increases, gate to source voltage VGS2 of n-type TFT device Q1B decreases. The decrease of gate to source voltage VGS2 then causes a decrease of the drain to source current of n-type TFT device Q1B. The decrease of the drain to source current accordingly lowers the voltage level of node N1A. The decrease of the voltage level of node N1A causes an increase of gate to source voltage VGS2 of n-type TFT device Q1B and accordingly an increase of the drain to source current.

Consequently, the voltage level of node N1A remains substantially the same and is kept at a constant level. Since drain to source voltage VDS1 of n-type TFT device Q1A thus remains unchanged, drain to source current IDS is kept at drive current $I_{EL}$. Finally, the current flowing from node N1B to supply voltage VL is determined by the minimum path of the current that is predetermined current $I_{EL}$. As a result, in the display mode, desired current $I_{EL}$ without being influenced by transistor characteristics flows through organic light-emitting diode OLED.

Accordingly, in a plurality of pixel circuits 10A arranged in display unit 20, regardless of differences between n-type TFT devices Q1A which are current source transistors, electric current that is set according to a display brightness is driven to respective organic light-emitting diodes OLEDs with high precision. In this way, occurrence of nonuniform display can be prevented.

As discussed above, in accordance with the first embodiment of the present invention, variations of the drain to source voltage of the current source transistor provided in the pixel circuit can be prevented to precisely drive desired electric current to the light-emitting devices and thereby prevent occurrence of nonuniform display.

SECOND EMBODIMENT

Figure 5:
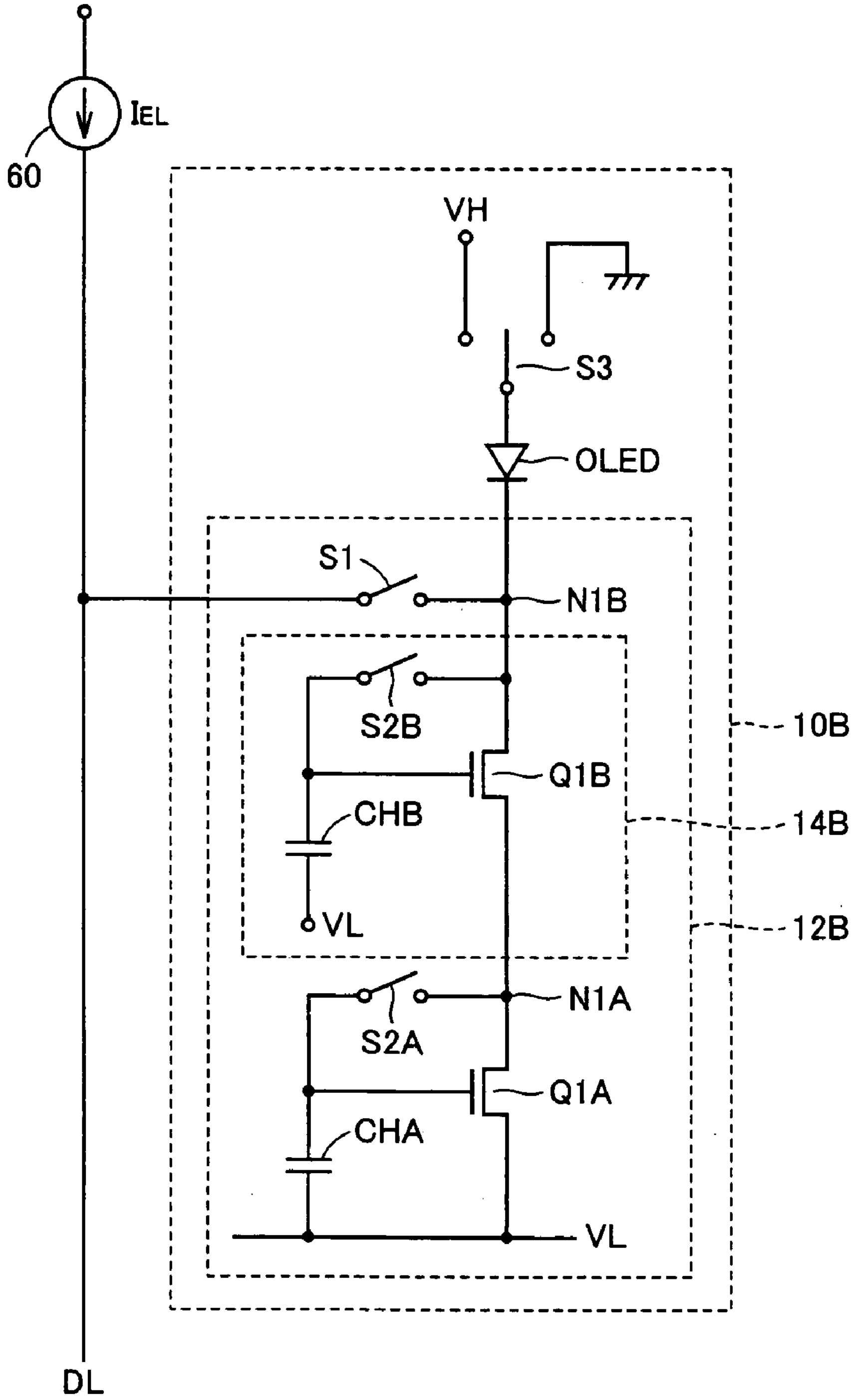
FIG. 5 is a circuit diagram showing a configuration of a pixel circuit of an image display apparatus according to a second embodiment of the present invention.

FIG. 5 is a circuit diagram showing a configuration of a pixel circuit of an image display apparatus according to a second embodiment of the present invention. The image display apparatus of the present embodiment is similar in configuration to the image display apparatus of the first embodiment except for a pixel circuit 10B described below, and thus the description of like components is not repeated here.

Referring to FIG. 5, pixel circuit 10B includes an organic light-emitting diode OLED and a pixel drive circuit 12B for supplying electric current $I_{EL}$ according to a specified display brightness.

Pixel drive circuit 12B includes an n-type TFT device Q1A that is a current source transistor, a voltage holding capacitor CHA and switches S1, S2A, S3.

Pixel drive circuit 12B further includes an n-type TFT device Q1B connected between organic light-emitting diode OLED and n-type TFT device Q1A serving as a current drive device, as well as a capacitor CHB and a switch S2B.

It is clearly seen from a comparison between FIG. 5 and FIG. 2 that pixel drive circuit 12B is similar in configuration to above-described pixel drive circuit 12A and thus the detailed description thereof is not repeated here. It is noted that n-type TFT device Q1B, capacitor CHB and switch S2B constitute a drain voltage increase limiter circuit 14B, like the one in FIG. 2, for limiting an increase of the drain voltage (corresponding to node N1A) of n-type TFT device Q1A.

As clearly seen from FIG. 5, pixel circuit 10B of the second embodiment differs from pixel circuit 10A in FIG. 2 only in that switch S3 of the second embodiment is provided between the anode of organic light-emitting diode OLED and supply voltage VH.

Specifically, switch S3 performs a switching operation according to a control signal that specifies a mode of the display apparatus to selectively couple the anode of organic light-emitting diode OLED to one of supply voltage VH and a power supply node that supplies a ground voltage. Here, this power supply node is not limited to the ground voltage and may supply any voltage by which forward current does not flow through organic light-emitting diode OLED. Alternatively, as the connection state of the anode of organic light-emitting diode OLED, one of the state in which the anode is coupled to supply voltage VH and the state in which the anode is opened may be selected.

In a data write mode, switch S3 electrically couples the anode of organic light-emitting diode OLED to the ground voltage. At this time, to the cathode of organic light-emitting diode OLED, drive current $I_{EL}$ is supplied through switch S1 from a data line DL. Since organic light-emitting diode OLED is now in a reverse-biased state, however, drive current $I_{EL}$ does not flow through organic light-emitting diode OLED.

In a display mode, switch S3 electrically couples the anode of organic light-emitting diode OLED to supply voltage VH. In this case, pixel circuit 10B has the same circuit configuration as that in the display mode of the first embodiment, and accordingly, drive current $I_{EL}$ according to data is supplied to organic light-emitting diode OLED.

As a modification of the present embodiment, instead of using this switch S3, a configuration may be used in which a pulse signal making transitions between supply voltage VH and the ground voltage is applied to the anode of organic light-emitting diode OLED. This pulse signal is controlled in such a way that allows the pulse signal to have supply voltage VH for its pulse width corresponding to the period of the display mode and to have the ground voltage in the remaining period. Here, the power supply node is not limited to the ground voltage and may supply any voltage by which forward current does not flow through organic light-emitting diode OLED.

The above-discussed configuration can be used to eliminate switch S3 and its control signal from pixel circuit 10B and thereby reduce any defects of the switch and lines that could cause lower yields of the image display apparatus.

Thus, in accordance with the second embodiment of the present invention, desired electric current can precisely be driven to the light-emitting device without being influenced by characteristics of the current source transistor and accordingly occurrence of nonuniform display can be prevented.

Further, the switching function of the switch may be replaced with the pulse signal to simplify the circuit configuration and thereby improve yields.

THIRD EMBODIMENT

According to a third embodiment, as a variation of the configuration of the first embodiment, a configuration in which the TFT device of the pixel circuit has the opposite polarity is described.

Figure 6:
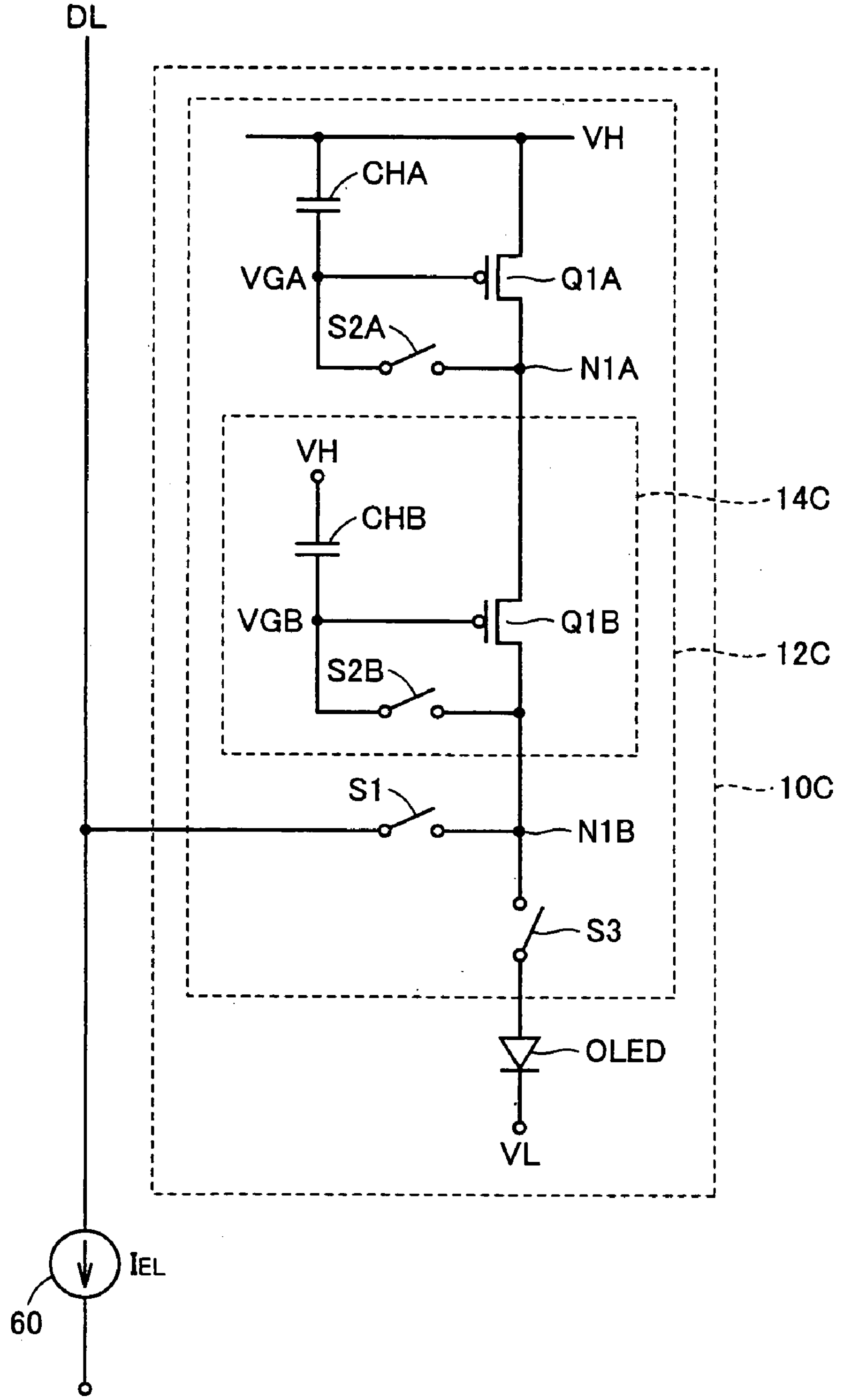
FIG. 6 is a circuit diagram showing a configuration of a pixel circuit of an image display apparatus according to a third embodiment of the present invention.

FIG. 6 is a circuit diagram showing a configuration of a pixel circuit of an image display apparatus according to the third embodiment of the present invention.

Referring to FIG. 6, pixel circuit 10C includes an organic light-emitting diode OLED and a pixel drive circuit 12C.

Organic light-emitting diode OLED has its anode connected through a switch S3 to a node N1B and its cathode connected to a supply voltage VL.

Pixel drive circuit 12C includes a p-type TFT device Q1A serving as a current drive device, a voltage holding capacitor CHA and switches S1, S2A, S3.

P-type TFT device Q1A has its source connected to a supply voltage VH and its drain diode-connected to the gate through switch S2A. Voltage holding capacitor CHA is connected between the gate of p-type TFT device Q1A and supply voltage VH.

Pixel drive circuit 12C further includes a p-type TFT device Q1B, a capacitor CHB and a switch S2B.

P-type TFT device Q1B has its source connected to the drain (corresponding to a node N1A) of p-type TFT device Q1A, its drain connected to node N1B and its gate diode-connected through switch S2B.

Capacitor CHB is connected between the gate of p-type TFT device Q1B and supply voltage VH.

Switch S1 is turned on in response to a control signal specifying a mode of the display apparatus to electrically connect a data line DL to node N1B. Switches S2A and S2B are turned on in response to a control signal specifying a mode of the display apparatus to diode-connect p-type TFT devices Q1A and Q1B respectively. Switch S3 is turned on in response to a control signal specifying a mode of the display apparatus to electrically couple the anode of organic light-emitting diode OLED to node N1B.

As shown in FIG. 6, p-type TFT device Q1B, capacitor CHB and switch S2B are provided between organic light-emitting diode OLED and node N1A to constitute a drain voltage decrease limiter circuit 14C that limits a decrease of the drain voltage of p-type TFT device Q1A. As described below, drain voltage decrease limiter circuit 14C serves to adjust, to a desired magnitude, current $I_{EL}$ that is driven from supply voltage VH through p-type TFT device Q1A to organic light-emitting diode OLED.

Specifically, variations of the drain voltage (node N1A) of p-type TFT device Q1A that is a current source transistor are prevented to eliminate influences of transistor characteristics from drive current $I_{EL}$ and thereby control drive current $I_{EL}$ so that the drive current is set at a desired level according to a display brightness. Namely, these components have the function equivalent to that of drain voltage increase limiter circuit 14A described in connection with the first embodiment.

In the above-described configuration, in a data write mode, switches S1, S2A, S2B are turned on first. Then, a current path of current $I_{EL}$ is formed from supply voltage VH through p-type TFT devices Q1A and Q1B to data line DL.

At p-type TFT devices Q1A and Q1B, respective drain to source voltages VDS1 and VDS2 necessary for allowing drive current $I_{EL}$ to flow are generated respectively. Since p-type transistors Q1A and Q2A are diode-connected, these transistors operate in a saturation region.

It is supposed here that p-type TFT devices Q1A and Q1B are identical in size and characteristics. Then, respective drain to source voltages are equal to each other (VDS1=VDS2). Further, respective voltages between respective gates of p-type TFT devices Q1A and Q1B and supply voltage VH, namely VG1 and VG2 have a relation of VG2=2VG1.

Then, when switches S1, S2A, S2B are turned off, voltage holding capacitors CHA and CHB hold respective gate voltages VG1 and VG2 of relevant p-type TFT devices Q1A and Q1B.

As the mode changes from the data write mode to a display mode, switch S3 is turned on. Accordingly, a current path is formed by p-type TFT devices Q1A and Q1B and organic light-emitting diode OLED between supply voltage VH and supply voltage VL.

If p-type TFT device Q1A is an ideal transistor, drain to source current IDS remains the same in the saturation region even when the drain to source voltage VDS changes due to variations of the voltage on node N1B.

Actually, however, when the voltage on node N1B decreases from (VH−2VDS) to (VF+VL) that is the sum of supply voltage VL and an amount of decrease VF in voltage of organic light-emitting diode OLED, drain to source voltage VDS2 of p-type TFT device Q1B increases to cause the drain to source current to increase from $I_{EL}$ to $I_{EL}''$ due to the channel modulation.

Here, if drain to source current IDS of p-type TFT device Q1B increases, this current also flows through p-type TFT device Q1A that is connected in series therewith and the increase of the current of p-type TFT device Q1A causes a decrease of the voltage level of node N1A. Accordingly, gate to source voltage VGS2 of p-type TFT device Q1B decreases to operate to decrease drain to source current IDS.

As a result, the voltage level of node N1A remains substantially the same, thus drain to source voltage VDS of p-type TFT device Q1A is constant, and drain to source current IDS is held at predetermined current $I_{EL}$. Thus, in the display mode, desired current $I_{EL}$ that is not influenced by transistor characteristics flows through organic light-emitting diode OLED.

It is noted that any configuration similar to that of the second embodiment is applicable as well to pixel circuit 10C of the third embodiment. Specifically, switch S3 in FIG. 6 that is provided between the anode of organic light-emitting diode OLED and node N1B may be provided instead between the cathode of organic light-emitting diode OLED and supply voltage VL so that switch S3 selectively couples the cathode of organic light-emitting diode OLED to one of supply voltage VL and a power supply node providing a predetermined voltage. The predetermined voltage here is set to any voltage by which forward current does not flow thorough organic light-emitting diode OLED. Alternatively, switch S3 may be used to select one of the state in which the cathode of organic light-emitting diode OLED is coupled to supply voltage VL and a state in which the cathode is opened.

Alternatively, as the modification of the second embodiment, instead of using switch S3, a pulse signal making transitions between supply voltage VL and the aforementioned predetermined voltage may be applied to the cathode of organic light-emitting diode OLED.

As heretofore discussed, in accordance with the third embodiment of the present invention, a plurality of pixel circuits provided in the display unit each have the current source transistor of the opposite polarity. In this case as well, variations of the drain voltage of the transistor are prevented and electric current that is set according to a display brightness is driven with high precision to each organic light-emitting diode OLED. Thus, occurrence of nonuniform display can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An image display apparatus comprising:

a plurality of pixel circuits arranged in rows and columns and each having a current-driven light-emitting device;

a plurality of scan lines arranged correspondingly to respective rows of said plurality of pixel circuits and successively selected in constant cycles;

a plurality of data lines arranged correspondingly to respective columns of said plurality of pixel circuits; and a constant current circuit provided correspondingly to said plurality of data lines and supplying, to said plurality of data lines each, drive current that is set according to a display brightness of a pixel circuit to be scanned among said plurality of pixel circuits, wherein said plurality of pixel circuits each include:

a node electrically coupled to a corresponding data line in a first mode to allow said drive current to flow into/out of said node and electrically separated from said corresponding data line in a second mode performed subsequently to said first mode;

a pixel drive circuit connected between said node and a first voltage supply, writing said drive current flowing into/out of said node in said first mode and supplying, to said current-driven light-emitting device, current according to said written drive current in said second mode; and said current-driven light-emitting device provided between said node and a second voltage supply and rendered conductive in said second mode to be supplied with said current according to said drive current, and said pixel drive circuit includes:

first and second transistors connected in series between said node and said first voltage supply and, in said first mode, said drive current passes through said first and second transistors; and first and second capacitor elements connected to respectively hold, on respective gate electrodes of said first and second transistors, voltages determined by said drive current in said first mode.

2. The image display apparatus according to claim 1, wherein said plurality of pixel circuits each further include:

a first switch element provided between said corresponding data line and said node, turned on in said first mode and turned off in said second mode;

second switch elements provided respectively between the gate electrode and a first electrode of said first transistor and between the gate electrode and said first electrode of said second transistor, turned on in said first mode and turned off in said second mode; and a third switch element provided between said node and said current-driven light-emitting device, turned off in said first mode and turned on in said second mode.

3. The image display apparatus according to claim 2, wherein said first switch element includes a first transistor of a first conductivity type electrically coupled between said corresponding data line and said node and having a gate coupled to said scan line (a corresponding scan line among said scan lines), said second switch elements include second transistors of the first conductivity type electrically coupled respectively between respective gates and drains of said first transistor and said second transistor and each having a gate coupled to said scan line, said third switch element includes a transistor of a second conductivity type electrically coupled between said node and said current-driven light-emitting device and having a gate coupled to said scan line, and said first mode is performed in a select period of said scan line and said second mode is performed in a non-select period of said scan line.

4. The image display apparatus according to claim 3, wherein said constant current circuit includes a plurality of constant current sources provided correspondingly to said plurality of data lines to supply said drive current to corresponding data lines.

5. The image display apparatus according to claim 4, wherein said first transistor has said first electrode connected to said node and a second electrode connected to said first electrode of said second transistor, said second transistor has said second electrode connected to said first voltage supply, and said second switch elements are set to allow, in said first mode, the gate electrode and said first electrode of said first transistor to be electrically separated earlier than at least the gate electrode and said first electrode of said second transistor.

6. The image display apparatus according to claim 1, wherein said plurality of pixel circuits each further include:

a first switch element provided between said corresponding data line and said node, turned on in said first mode and turned off in said second mode;

second switch elements provided respectively between the gate electrode and a first electrode of said first transistor and between the gate electrode and said first electrode of said second transistor, turned on in said first mode and turned off in said second mode;

a third voltage supply provided opposite to said second voltage supply; and a third switch element provided between said second voltage supply, said third voltage supply and said current-driven light-emitting device, electrically connecting said current-driven light-emitting device and said third voltage supply in said first mode and electrically connecting said current-driven light-emitting device and said second voltage supply in said second mode, and when said third voltage supply is coupled to said current-driven light-emitting device, a voltage of said third voltage supply allows, relative to a voltage of said node, said current-driven light-emitting device to be in a reverse-biased state.

7. The image display apparatus according to claim 1, wherein said plurality of pixel circuits each further include:

a first switch element provided between said corresponding data line and said node, turned on in said first mode and turned off in said second mode;

second switch elements provided respectively between the gate electrode and a first electrode of said first transistor and between the gate electrode and said first electrode of said second transistor, turned on in said first mode and turned off in said second mode; and a third switch element provided between said second voltage supply and said current-driven light-emitting device, electrically separating said current-driven light-emitting device from said second voltage supply in said first mode and electrically coupling said current-driven light-emitting device and said second voltage supply in said second mode.

8. The image display apparatus according to claim 1, wherein said plurality of pixel circuits each further include:

a first switch element provided between said corresponding data line and said node, turned on in said first mode and turned off in said second mode;

second switch elements provided respectively between the gate electrode and a first electrode of said first transistor and between the gate electrode and said first electrode of said second transistor, turned on in said first mode and turned off in said second mode; and pulse signal input means provided between said second voltage supply and said current-driven light-emitting device for applying, to said current-driven light-emitting device, a pulse signal having a voltage of a third voltage supply in said first mode and having a voltage of said second voltage supply in said second mode, and the voltage of said third voltage supply allows, relative to a voltage of said node, said current-driven light-emitting device to be in a reverse-biased state.

* * * * *